(12) United States Patent
Mochiku

(10) Patent No.: US 8,300,170 B2
(45) Date of Patent: Oct. 30, 2012

(54) ELECTRO-OPTICAL DEVICE, ELECTRONIC APPARATUS, AND TRANSISTOR

(75) Inventor: Hiroshi Mochiku, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 705 days.

(21) Appl. No.: 12/499,833

(22) Filed: Jul. 9, 2009

(65) Prior Publication Data
US 2010/0078666 A1 Apr. 1, 2010

(30) Foreign Application Priority Data

Sep. 26, 2008 (JP) ................. 2008-248539

(51) Int. Cl.
*G02F 1/136* (2006.01)
*G02F 1/1333* (2006.01)
(52) U.S. Cl. ............... 349/43; 349/110; 257/335
(58) Field of Classification Search .......... 349/43, 349/110, 41; 257/98, 347, E33.053, 59, 72, 257/E29.273, 335, 336
See application file for complete search history.

(56) References Cited

U.S. PATENT DOCUMENTS
6,559,913 B1 * 5/2003 Sera .................. 349/111

FOREIGN PATENT DOCUMENTS
| JP | 05-003209 | 1/1993 |
| JP | 06-252405 | 9/1994 |
| JP | 07-147411 | 6/1995 |
| JP | 2004-340981 | 12/2004 |

* cited by examiner

*Primary Examiner* — Thoi Duong
(74) *Attorney, Agent, or Firm* — AdvantEdge Law Group, LLC

(57) ABSTRACT

An electro-optical device includes a substrate, a data line, and a transistor formed on the substrate and including (i) a semiconductor film having a channel region having a channel length according to one direction, first and second source/drain regions which are formed with the channel region interposed therebetween, and first and second junction regions respectively formed between the first and second source/drain region and the channel region, and (ii) a gate electrode overlapping with the channel region, wherein at least one of the first and second junction regions is formed such that the width thereof is at least partially larger than that of the channel region.

9 Claims, 9 Drawing Sheets

ELECTRO-OPTICAL DEVICE, ELECTRONIC APPARATUS, AND TRANSISTOR

BACKGROUND

1. Technical Field

The present invention relates to technical fields of an electro-optical device such as a liquid crystal device, an electronic apparatus including the electro-optical device, and a transistor.

2. Related Art

In an electro-optical device, data lines and scan lines are provided in an image display region of a substrate so as to intersect each other, the pixel electrodes are provided on intersections between both lines in a matrix, and the switching of the pixel electrodes is controlled in each of the pixels. In each pixel, for example, a transistor having a Lightly Doped Drain (LDD) structure is provided as a pixel switching element for controlling the switching of each of the pixel electrodes. In the LDD structure, low-concentration impurities are injected into a semiconductor film of the transistor so as to form a low-concentration impurity region, and high-concentration impurities are injected so as to form a high-concentration impurity region. By electrolysis mitigation effect based on the mutual impurity concentration gradient of the low-concentration impurity region and the high-concentration impurity region, leak current (that is, off-leak current) upon non-operation of the transistor is reduced.

For example, JP-A-5-3209 discloses technology of forming a sidewall, injecting high-concentration impurities and forming a high-concentration impurity region after a low-concentration impurity region is formed in a semiconductor film. According to JP-A-5-3209, in order to reduce leak current of the transistor due to crystal defects of the low-concentration impurity region of the semiconductor film (silicon substrate), due to the existence of the sidewall, the sidewall is to be formed in a crescent shape or a concave shape.

However, according to JP-A-5-3209, a process of manufacturing the transistor may become troublesome by the processing of the sidewall. Accordingly, yield of the manufacturing process may deteriorate by such troublesome processing.

SUMMARY

An advantage of some aspects of the invention is that it provides an electro-optical device capable of more efficiently reducing leak current in a transistor with the LDD structure and being relatively easy to manufacture an electronic apparatus including the electro-optical device, and a transistor.

According to an aspect of the invention, there is provided an electro-optical device including: a substrate; data lines provided on the substrate; and transistors formed on the substrate and including (i) a semiconductor film having a channel region having a channel length according to one direction of the substrate, first and second source/drain regions which are formed with the channel region interposed therebetween and any one of which is electrically connected to the data line, and first and second junction regions respectively formed between the first and second source/drain region and the channel region, and (ii) a gate electrode overlapping with the channel region, wherein at least one of the first and second junction regions is formed such that the width thereof is at least partially larger than that of the channel region.

According to the electro-optical device of the invention, for example, a plurality of pixel electrodes is provided in a display region of the substrate in a matrix and, upon operation thereof, the supply of image signals from the data lines to the pixel electrodes is controlled, and an image display is achieved by a so-called active matrix method. The image signals are supplied from the data lines to the pixel electrodes via the transistors at predetermined timings by turning on/off the transistors which are switching elements electrically connected between the data lines and the pixel electrodes, for example, based on scan signals supplied from scan lines.

The transistors include the channel region, the semiconductor film having the first and second source/drain regions, and the gate electrode overlapping with the channel region.

The channel region has the channel length according to one direction of the substrate. The term "one direction" of the invention refers to, for example, a row direction of the plurality of pixels defined on the substrate in the matrix, that is, an arrangement direction in which the plurality of data lines is arranged, in other words, a direction (that is, an X direction) in which the plurality of scan lines extend, or a column direction of the plurality of pixels defined on the substrate in the matrix, that is, an arrangement direction in which the plurality of scan lines is arranged, in other words, a direction (that is, a Y direction) in which the plurality of data lines extend.

One of the first and second source/drain regions is electrically connected to the data lines, and the other thereof is electrically connected to the pixel electrodes. In addition, the first and second junction regions are respectively formed between the first and second source/drain regions and the channel region of the semiconductor film. That is, the first junction region is formed between the channel region and the first source/drain region, and the second junction region is formed between the channel region and the second source/drain region. The first and second junction regions refer to LDD regions (that is, for example, regions obtained by injecting a smaller amount of impurities into the semiconductor film compared with the source/drain regions by impurity injection such as an ion implantation method) if each of the transistors has an LDD structure. In this case, the first and second source/drain regions are formed as impurity regions of higher concentration than that of the LDD region.

In the invention, in particular, at least one of the first and second junction regions is formed such that the width thereof is at least partially larger than that of the channel region. For example, at least one of the first and second junction regions is formed such that the width of the source/drain region side corresponding thereto is larger than that of the channel region side (typically, the width is gradually increased from the channel region side to the source/drain region side corresponding thereto).

At least one of the junction regions is formed such that the impurity concentration thereof is lower than that of at least one of the source/drain region according to the above-described LDD structure. In this case, in the boundary to the corresponding source/drain region of at least one of the junction regions (that is, the boundary between at least one of the junction regions and the source/drain region corresponding to the junction region), the impurity concentration is changed from a low value to a high value. For example, according to the change in impurity concentration, in the invention, at least one of the junction regions is formed such that the width thereof is at least partially larger than that of the channel region. In more detail, in at least one of junction regions, the boundary to the corresponding source/drain region is formed such that the width thereof is larger than that of the boundary to the channel region (that is, the boundary between at least one of the junction regions and the channel region) and the width thereof is not decreased against the change in impurity concentration (from the low or small value to the high or large value). Accordingly, with respect to at least one of the junction regions as described above, the concentration gradient based on the change in impurity concentration in the boundary to the source/drain region can be supplementarily maintained by the wide shape. Thus, the electrolysis mitigation effect based on the concentration gradient between at least one of the junction regions and the source/drain region can be properly maintained and thus leak current can be reduced. In the invention, upon the design of the transistor, if the width of at least one of the junction regions is adjusted, it is possible to easily manufacture the transistor without performing a new process in the manufacturing process, compared with JP-A-5-3209.

In the electro-optical device of the invention, it is possible to suppress leak current of the transistor in each of the pixels so as to improve display quality and to manufacture the device by a simpler manufacturing process.

In the aspect of the electro-optical device of the invention, at least one of the source/drain regions may be formed such that the width thereof is at least partially larger than that of at least one of the junction regions.

According to this aspect, the width of the semiconductor film is increased from at least one of the junction regions to at least one of the source/drain region corresponding thereto with the boundary interposed therebetween. Accordingly, the width is not decreased against the change in impurity concentration in the boundary to the corresponding source/drain region of at least one of the junction regions with more certainty. Accordingly, the concentration gradient from at least one of the junction regions to at least one of the source/drain regions is maintained and thus electrolysis mitigation effect can be improved with more certainty.

In the aspect in which at least one of the source/drain regions is formed such that the width thereof is at least partially larger than that of at least one of the junction regions, the semiconductor film may be formed such that the width thereof is consecutively changed from at least one of the junction regions to at least one of the source/drain regions.

In this case, the dimension change in width of the semiconductor film is slow. In other words, the dimension gradient based on the dimension change in width is decreased. Therefore, influence on current density based on the concentration gradient of the impurities from at least one of the junction regions to at least one of source/drain regions is decreased and thus electrolysis mitigation effect can be further improved.

In another aspect of the electro-optical device of the invention, a light-shielding film formed between the substrate and the semiconductor film and having a main body portion extending in another direction intersecting one direction and an extension portion extending from the main body portion in one direction and at least partially overlapping with the semiconductor film may be further included, and the channel region may be disposed so as to overlap with a portion in which the main body portion and the extension portion intersect.

According to this aspect, the light-shielding film is formed so as to shield the semiconductor film of the transistor from light traveling from the substrate side. Since the extension portion of the light-shielding film is formed so as to at least partially overlap with the semiconductor film along the semiconductor film, the light traveling to the semiconductor film can be at least partially shielded by the extension portion.

In this aspect, the channel region of the semiconductor film is disposed so as to overlap with the portion in which the main body portion and the extension portion intersect. The term "another direction" along the extending direction of the main body portion refers to the X direction or the Y direction intersecting "one direction". The light having the travel direction, which can be shielded by the extension portion and the main body portion, can be shielded by the intersecting portion of the extension portion and the main body portion. Accordingly, the light traveling in the channel region can be shielded with more certainty and light leak current of the transistor can be suppressed. As a result, it is possible to perform a high-quality display in the electro-optical device.

In the aspect in which the light-shielding film is included, the light-shielding film may be formed such that the width of a portion of the extension portion overlapping with the second junction region is larger than that of a portion of the extension portion overlapping with the first junction region, and the first junction region may be formed with a width at least partially larger than that of the channel region.

In this case, the second junction region can be shielded by the extension portion of the light-shielding film in a wider region of the substrate than the first junction region. As described below, in the semiconductor film, if the first junction region is electrically connected to the data lines and, particularly, the second junction region is electrically connected to the pixel electrodes, light leak current is relatively more easily generated in the second junction region, compared with in the first junction region. Accordingly, in this case, if the configuration of this aspect, the light-shielding property of the second junction region can be further improved by the extension portion and light leak current can be reduced with more certainty.

In contrast, even when the light-shielding property of the first junction region further deteriorates than the second junction region by light shielding by the extension portion of the light-shielding film, the concentration gradient of the impurities in the boundary to the first source/drain region of the first junction region can be supplementarily maintained by the wide shape. As a result, even in the first junction region, the generation of light leak current can be suppressed by the electrolysis mitigation effect based on the concentration gradient of the impurities in the boundary to the first source/drain region.

In the extension portion of the light-shielding film, with respect to the portion overlapping with the first junction region with the small width, based on the step difference shape generated in the direction intersecting the extending direction of the extension portion, in the first junction region, the width is locally decreased in the boundary to the first source/drain region, and thus a constricted shape may be generated. In this aspect, the width of the first junction region is not decreased in the boundary to the first source/drain region and thus the constricted shape can be prevented from being generated.

In the aspect in which the first junction regions is formed such that the width thereof is at least partially larger than that of the channel region, pixel electrodes electrically connected to the data lines with the transistor interposed therebetween may be further included, and the first source/drain region may be electrically connected to the data line, and the second source/drain region may be electrically connected to each of the pixel electrodes.

In this case, the first junction region is electrically connected to the data line and the second junction region is electrically connected to the pixel region. Accordingly, it is possible to further improve the light-shielding property of the second junction region by the extension portion of the light-shielding film and to reduce light leak current with more certainty.

According to another aspect of the invention, there is provided an electronic apparatus including the above-described electro-optical device (including the aspects thereof).

Since the electronic apparatus of the invention includes the electro-optical device of the invention, it is possible to realize various types of electronic apparatuses capable of performing a high-quality display and being manufactured by a simpler manufacturing process, such as a projection type display device, a mobile telephone, an electronic organizer, a word processor, a viewfinder-type or direct-view monitor type video tape recorder, a workstation, a videophone, a POS terminal, and a touch-panel-equipped device.

According to another aspect of the invention, there is provided a transistor formed on a substrate, the transistor comprising: a semiconductor film having a channel region having a channel length according to one direction of the substrate, first and second source/drain regions which are formed with the channel region interposed therebetween, and first and second junction regions respectively formed between the first and second source/drain region and the channel region, and a gate electrode overlapping with the channel region, and a gate electrode overlapping with the channel region, wherein at least one of the first and second junction regions is formed such that the width thereof is at least partially larger than that of the channel region.

According to the transistor of the invention, it is possible to reduce leak current and to relatively easily manufacture the transistor, similar to the electro-optical device of the invention.

The operations and other features of the invention will be apparent from the following description of the exemplary embodiments.

BRIEF DESCRIPTION OF THE DRAWINGS

The invention will be described with references to the accompanying drawings, wherein like numbers reference like elements.

DESCRIPTION OF EXEMPLARY EMBODIMENTS

Hereinafter, an electro-optical device and an electronic apparatus according to embodiments of the invention will be described. In addition, in the present embodiment, a TFT active matrix driving type liquid crystal device including a driving circuit mounted therein will be described as an example of the electro-optical device.

First, the overall configuration of the liquid crystal device according to the present embodiment will be described with reference to FIGS. 1 and 2.

Figure 1:
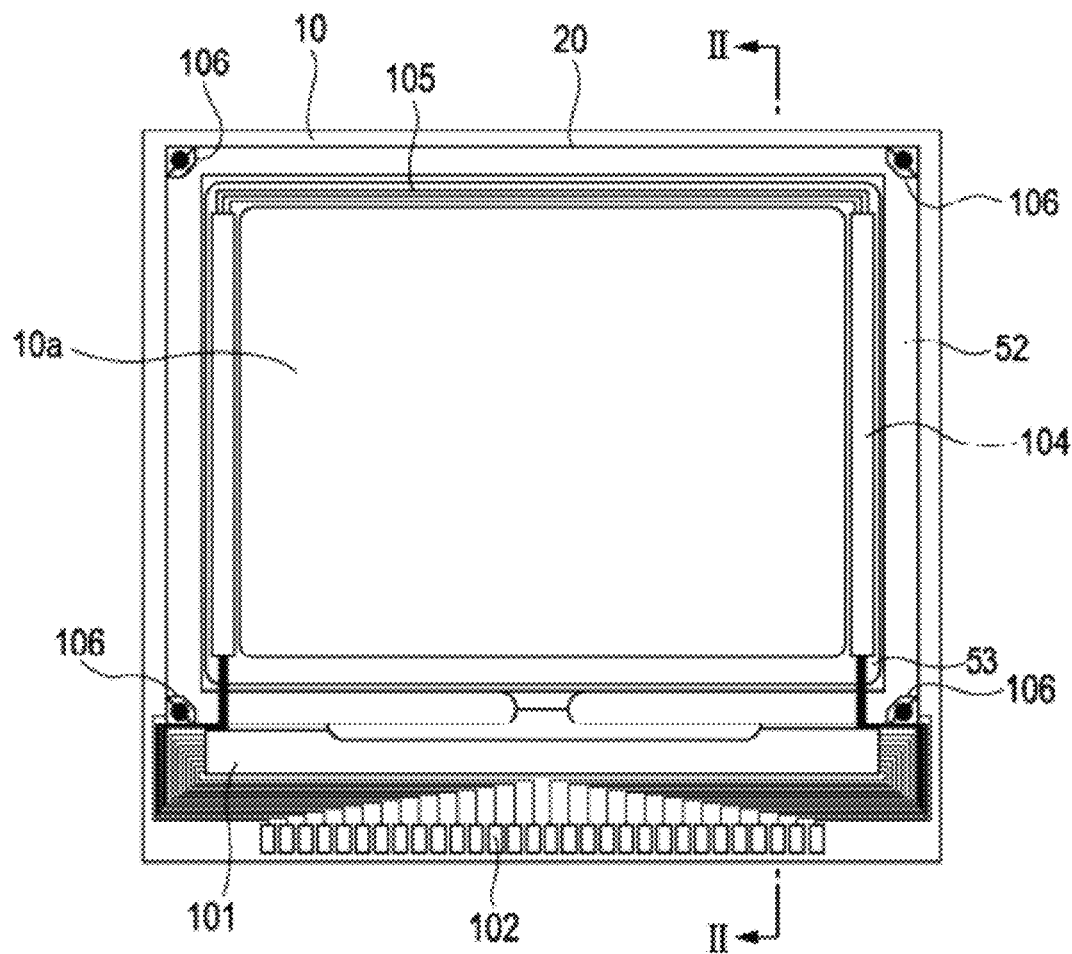
FIG. 1 is a schematic plan view of a liquid crystal device.
Figure 2:
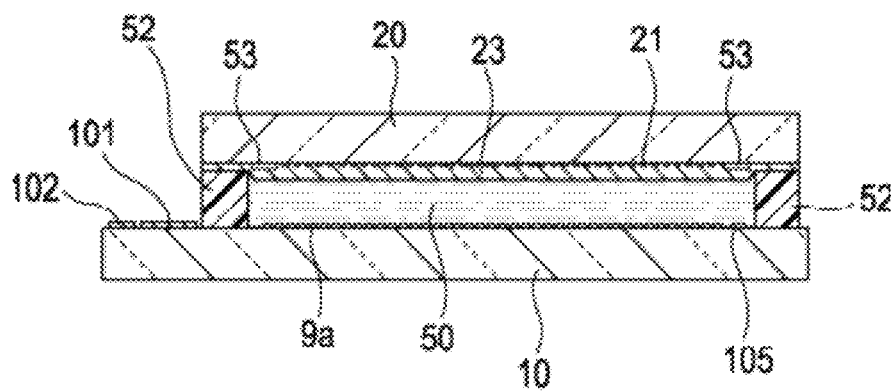
FIG. 2 is a cross-sectional view taken along line II-II of FIG. 1.

FIG. 1 is a plan view of the liquid crystal device when a TFT array substrate is viewed from a counter substrate side together with components formed thereon, and FIG. 2 is a cross-sectional view taken along line II-II of FIG. 1.

In FIGS. 1 and 2, in the liquid crystal device according to the present embodiment, the TFT array substrate 10 and the counter substrate 20 face each other. The TFT array substrate 10 is, for example, a transparent substrate such as a quartz substrate or a glass substrate, or a silicon substrate. The counter substrate 20 is preferably a transparent substrate similar to the TFT array substrate 10. A liquid crystal layer 50 is enclosed between the TFT array substrate 10 and the counter substrate 20. The TFT array substrate 10 and the counter substrate 20 are bonded to each other by a seal material 52 provided in a seal region located at the periphery of an image display region 10a.

The seal material 52 is formed of, for example, ultraviolet curing resin or thermosetting resin for bonding both substrates, is coated on the TFT array substrate 10 and is cured by irradiating an ultraviolet ray or performing heating treatment in a manufacturing process. In the seal material 52, a gap material for holding a gap (inter-substrate gap) between the TFT array substrate 10 and the counter substrate 20 at a predetermined value, such as glass fiber or glass beads, is dispersed. The liquid crystal device according to the present embodiment is used as a light valve of a projector, has a small size, and is suitable for performing a magnified display.

A frame light-shielding film 53 defining a frame region of the image display region 10a is provided on the counter substrate 20 at the inside of the seal region in which the seal material 52 is provided. A portion or whole of the frame light-shielding film 53 may be provided on the TFT array substrate 10 as a built-in light-shielding film.

In a region located outside the seal region, in which the seal material 52 is provided, of a peripheral region, a data line driving circuit 101 and an external circuit connection terminal 102 are provided along one side of the TFT array substrate 10. Scan line driving circuits 104 are provided along two sides adjacent to one side so as to cover the frame light-shielding film 53. In addition, in order to connect two scan line driving circuits 104 provided at both sides of the image display region 10a, a plurality of wires 105 is provided along one remaining side of the TFT array substrate 10 so as to cover the frame light-shielding film 53.

Upper/lower conductive materials 106 are arranged on four corners of the counter substrate 20 between both substrates. Upper/lower conductive terminals are provided on the TFT array substrate 10 in regions which face these corners. Accordingly, the TFT array substrate 10 and the counter substrate 20 are electrically conducted.

In FIG. 2, on the TFT array substrate 10, a laminated structure made of pixel switching TFTs which are driving elements or wires such as scan lines and data lines is formed. In the image display region 10a, pixel electrodes 9a are provided in a matrix on the pixel switching TFTs or the wires such as the scan lines and the data lines. An alignment film (not shown in FIG. 2) is formed on the pixel electrodes 9a. Meanwhile, a light-shielding film 23 is formed on a surface of the counter substrate 20 facing the TFT array substrate 10. The light-shielding film 23 is formed of, for example, a light-shielding metal film or the like and is patterned, for example, in a lattice shape in the image display region 10a of the counter substrate 20. A counter electrode 21 formed of a transparent material such as Indium Tin Oxide (ITO) is solidly formed on the light-shielding film 23 (below the light-shielding film 23 in FIG. 2) so as to face the plurality of pixel electrodes 9a. An alignment film (not shown in FIG. 2) is formed on the counter electrode 21 (below the counter electrode 21 in FIG. 2). The liquid crystal layer 50 is formed of, for example, one type or various types of nematic liquid crystal, and is in a predetermined alignment state between the pair of alignment films.

In addition, a sampling circuit for sampling and supplying image signals of image signal lines to the data lines, a precharge circuit for supplying a precharge signal having a predetermined voltage level to the plurality of data lines prior to the image signals, or a test circuit for testing the quality and the defect of the electro-optical device during manufacturing or before shipment may be formed on the TFT array substrate 10 shown in FIGS. 1 and 2, in addition to the data line driving circuit 101 and the scan line driving circuits 104.

Next, the electrical configuration of the pixel portions of the liquid crystal device according to the present embodiment will be described with reference to FIG. 3.

Figure 3:
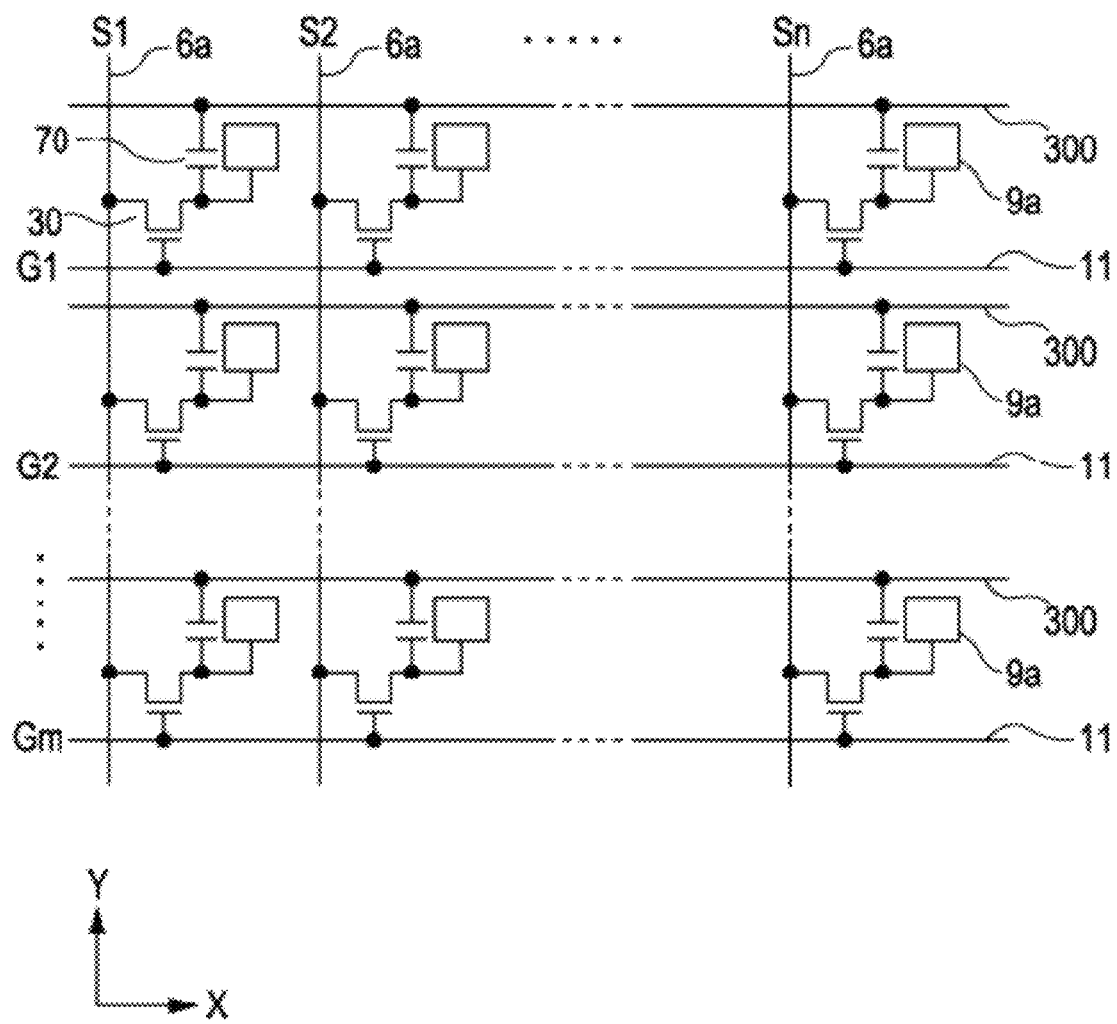
FIG. 3 is an equivalent circuit diagram of various types of elements and wires in a plurality of pixels formed in a matrix configuring an image display region of the liquid crystal device according to the present embodiment.

FIG. 3 is an equivalent circuit diagram of various types of elements and wires in the plurality of pixels formed in a matrix configuring the image display region of the liquid crystal device according to the present embodiment.

In FIG. 3, TFTs 30 which are an example of "transistors" according to the invention and the pixel electrode 9a are formed in the plurality of pixels formed in the matrix configuring the image display region 10a. The TFTs 30 are electrically connected to the pixel electrodes 9a, and control the switching of the pixel electrodes 9a when the liquid crystal device is operated. The data lines 6a via which the image signals is supplied are electrically connected to sources of the TFTs 30. The image signals S1, S2, . . . , and Sn written into the data lines 6a may be line-sequentially supplied in this order or may be supplied to every groups of a plurality of adjacent data lines 6a.

The scan lines 11 are electrically connected to gates of the TFTs 30, and the liquid crystal device according to the present embodiment is configured such that scan signals G1, G2, . . . , and Gm are line-sequentially applied to the scan lines 11 in a pulsed manner at predetermined timings. The pixel electrodes 9a are electrically connected to drains of the TFTs 30, and the image signals S1, S2, . . . , and Sn supplied from the data lines 6a are written at predetermined timings by closing the TFTs 30 which are the switching elements only during a predetermined period. The image signals S1, S2, . . . , and Sn having the predetermined level and written into the liquid crystal which is an example of the electro-optical material via the pixel electrodes 9a are held between the counter electrode formed on the counter substrate and the pixel electrodes during a predetermined period.

In the liquid crystal configuring the liquid crystal layer 50 (see FIG. 2), the alignment or order of a set of molecules is changed by the level of an applied voltage such that light is modulated and grayscale display becomes possible. Transmissivity of the incident light decreases according to the applied voltage in the unit of pixels in a normally white mode, and transmissivity of the incident light increases according to the applied voltage in the unit of pixels in a normally black mode. Light having contrast according to the image signals is wholly emitted from the liquid crystal device.

In order to prevent the held image signals from being leaked, storage capacitors 70 are provided in parallel with liquid crystal capacitors formed between the pixel electrodes 9a and the counter electrode 21 (see FIG. 2). The storage capacitors 70 are capacitive elements functioning as storage capacitors for temporarily holding the potential of the pixel electrodes 9a according to the supply of the image signals. One electrode of each of the storage capacitors 70 is connected to the drain of each of the TFTs 30 in parallel with each of the pixel electrodes 9a, and the other electrode thereof is connected to each of capacitive lines 300 having a fixed potential so as to have a constant potential. According to the storage capacitors 70, the potential holding characteristics of the pixel electrodes 9a are improved and thus improvement of display characteristics such as improvement of contrast or reduction of flicker can be achieved. In addition, the storage capacitors 70 function as a built-in light-shielding film for blocking the light incident to the TFTs 30, as described below.

Next, the specific configuration of the pixel portions for realizing the above-described operation will be described with references to FIGS. 4 and 5.

Figure 4:
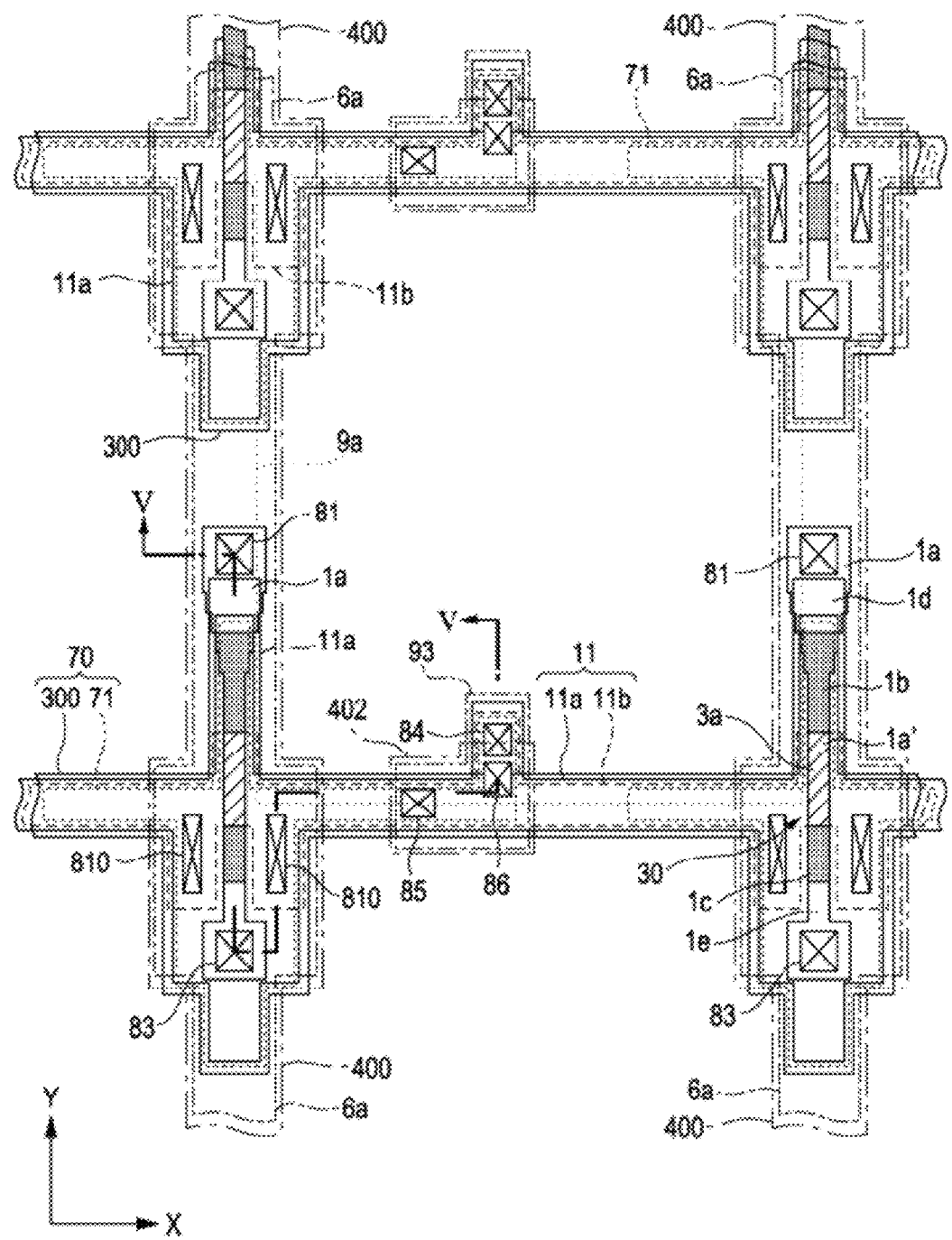
FIG. 4 is a plan view of a plurality of pixel portions which are adjacent to each other.
Figure 5:
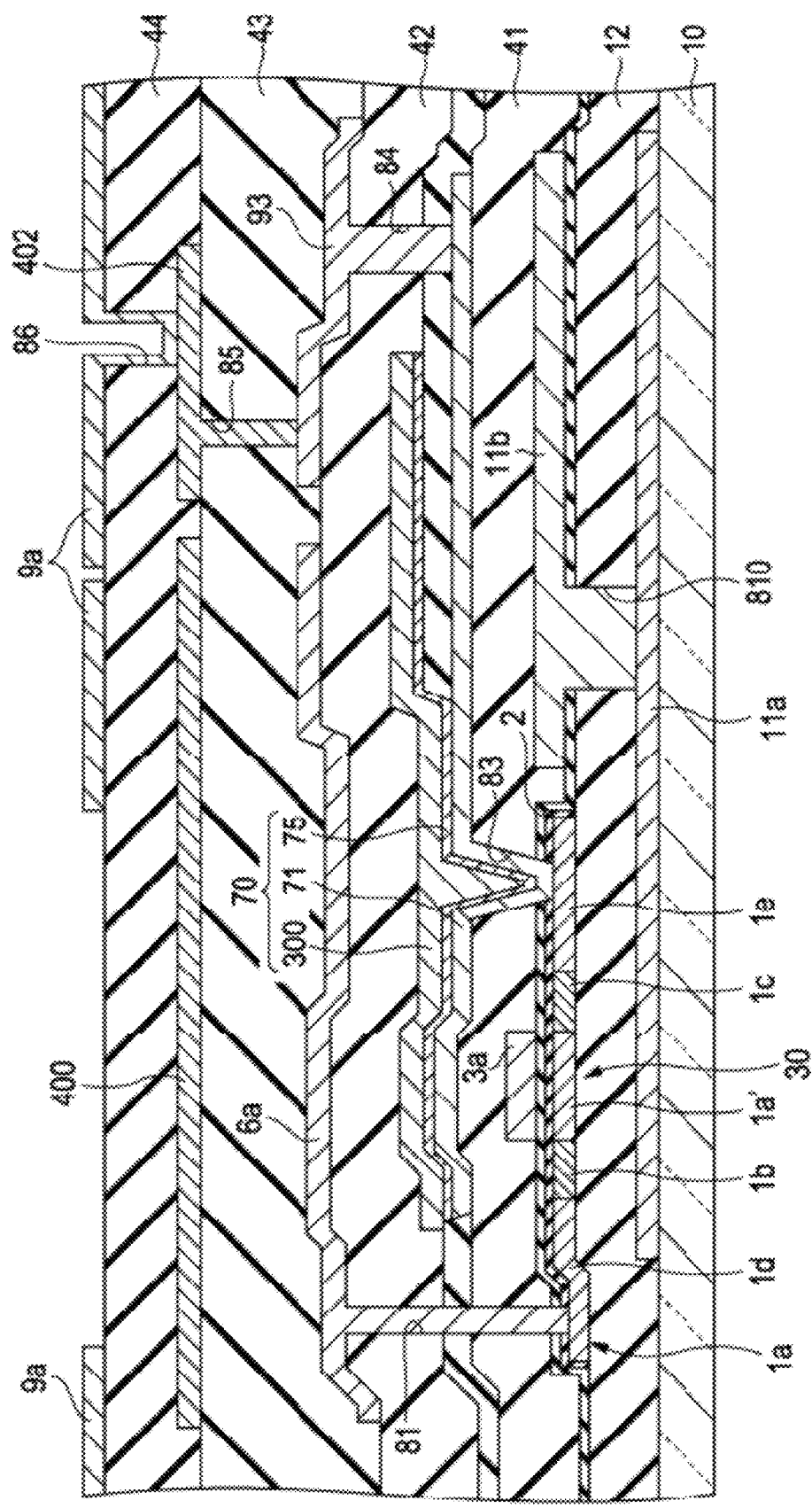
FIG. 5 is a cross-sectional view taken along line V-V of FIG. 4.

FIG. 4 is a plan view of a plurality of pixel portions which are adjacent to each other, and FIG. 5 is a cross-sectional view taken along line V-V of FIG. 4. In FIGS. 4 and 5, the scale of each layer or each member is differentiated from each other in order that each layer or each member has a size capable of being identified in this view. The same is true in the following drawings. In FIGS. 4 and 5, for convenience of description, a portion located at the upper side of the pixel electrodes 9a is not shown.

In FIG. 4, the pixel electrodes 9a are provided on the TFT array substrate 10 in a matrix. In addition, FIG. 4 schematically shows the configuration of the pixel electrode 9a of any one pixel. The data lines 6a and the scan lines 11 are provided along the vertical and horizontal boundaries of the pixel electrode 9a, respectively. That is, the scan lines 11 extend in an X direction, and the data lines 6a extend in a Y direction so as to intersect the scan line 11. In addition, each of the scan lines 11 includes a first scan line 11a which also functions as a lower light-shielding film and a second scan line 11b integrally formed with a gate electrode 3a, and is doubly provided in the X direction. The pixel switching TFTs 30 are provided at the intersections between the scan lines 11 and the data lines 6a. Since the first scan line 11a and the second scan line 11b are doubly provided, the electrical resistance of the scan lines 11 can be wholly decreased. In addition, even when one of the first scan line 11a and the second scan line 11b is disconnected, the other of the scan lines can be redundantly operated and thus reliability of the liquid crystal device can be improved.

The scan lines 11, the data lines 6a, the storage capacitors 70, the TFTs 30, a shield layer 400, relay layers 93 and 402 and the like are disposed in non-opening regions (that is, regions in which light actually contributing to the display is transmitted or reflected in the pixels) surrounding opening regions of the pixels corresponding to the pixel electrodes 9a on the TFT array substrate 10 in plan view. That is, the scan lines 11, the data lines 6a, the storage capacitors 70, the TFTs 30, the shield layer 400, the relay layers 93 and 402 and the like are not disposed in the opening regions of the pixels, but are disposed in the non-opening regions so as not to disturb the display.

Hereinafter, the laminated structure of the pixel portions on the TFT array substrate 10 will be sequentially described from a first layer.

On a first layer, the first scan line 11a is provided by conductive polysilicon, high melting point metal, high melting point metal silicide or the like with, for example, a film thickness of 200 nm. The first scan line 11a has a portion extending in the X direction and a portion extending from the above-described portion in the Y direction so as to overlap with a channel region 1a' of the TFT 30, as shown in FIG. 4.

As shown in FIG. 4, the first scan line 11a is preferably formed so as to include regions facing the channel region 1a' of the TFT 30, a data line side LDD region 1b and a pixel electrode side LDD region 1c, and a data line side source/drain region 1d and a pixel electrode side source/drain region 1e. Accordingly, by the first scan line 11a, it is possible to mostly or completely shield the channel region 1a' of the TFT 30 from the returning light passing through a synthetic optical system emitted from another liquid crystal device by rear surface reflection of the TFT array substrate 10 or a double-plate type projector. That is, the first scan line 11a functions as a wire for supplying the scan signal and functions as the lower light-shielding film of the TFT 30 against the return light.

In FIG. 5, the scan line 11a of the first layer and the TFT 30 of the second layer are insulated by an underlying insulating film 12. The underlying insulating film 12 has a function for preventing deterioration of the characteristics of the pixel switching TFT 30 by dirt left after cleaning or roughness upon polishing of the surface of the TFT array substrate 10, by forming the underlying insulating film on the entire surface of the TFT array substrate 10, in addition to the function for insulating the TFT 30 from the first scan line 11a. In addition, the underlying insulating film 12 has, for example, a double-layer structure obtained by laminating a TEOS (ethyl silicate) film with the thickness of 300 nm and a High Temperature Oxide (HTO) film having a film thickness of 50 nm.

On the second layer, the TFT 30 including a semiconductor film 1a and a gate electrode 3a is provided.

As shown in FIGS. 4 and 5, the semiconductor film 1a for example is formed of, polysilicon with a film thickness of 55 nm, and includes the channel region 1a' having a channel length in the Y direction, the data line side LDD region 1b and the pixel electrode side LDD region 1c, and the data line side source/drain region 1d and the pixel electrode side source/drain region 1e. That is, the TFT 30 has an LDD structure. In addition, the data line side LDD region 1b is an example of a "first junction region" according to the invention, and the pixel electrode side LDD region 1c is an example of a "second junction region" according to the invention. The data line side source/drain region 1d is an example of a "first source/drain region" according to the invention, and the pixel electrode side source/drain region 1e is an example of a "second source/drain region" of the invention.

The data line side source/drain region 1d and the pixel electrode side source/drain region 1e are formed in substantial mirror symmetry in the Y direction with respect to the channel region 1a'. The data line side LDD region 1b is formed between the channel region 1a' and the data line side source/drain region 1d. The pixel electrode side LDD region 1c is formed between the channel region 1a' and the pixel electrode side source/drain region 1e. The data line side LDD region 1b, the pixel electrode side LDD region 1c, the data line side source/drain region 1d and the pixel electrode side source/drain region 1e are, for example, impurity regions obtained by injecting impurities into the semiconductor film 1a by impurity injection such as an ion implantation method. The data line side LDD region 1b and the pixel electrode side LDD region 1c are formed as impurity regions having low impurity concentration than that of the data line side source/drain region 1d and the pixel electrode side source/drain region 1e. According to such impurity regions, upon non-operation of the TFT 30, off current flowing into the data line side source/drain region 1d and the pixel electrode side source/drain region 1e is reduced and deterioration of on current flowing upon operation of the TFT 30 can be suppressed. In addition, the TFT 30 preferably has an LDD structure, but may have an offset structure in which the impurities are not injected into the data line side LDD region 1b and the pixel electrode side LDD region 1c.

In FIGS. 4 and 5, the second scan line 11b is integrally formed with the gate electrode 3a by laminating, for example, conductive polysilicon and tungsten silicide (WSi) with a film thickness of 60 nm. As shown in FIG. 4, the second scan line 11b has a portion which extends in the Y direction so as to overlap with the channel region 1a' in plan view and functions as the gate electrode 3a, and a portion extending in the X direction from the portion extending in the Y direction in parallel with the first scan line 11a.

In the second scan line 11b, the gate electrode 3a integrally formed with the second scan line 11b is insulated by the semiconductor film 1a and the gate insulating film 2. In the present embodiment, as shown in FIGS. 4 and 5, in the underlying insulating film 12, the contact hole 810 is opened on the side of the semiconductor film 1a. The gate electrode 3a is continuously formed to the inside of the contact hole 810 and is electrically connected to the first scan line 11a.

In FIG. 5, an interlayer insulating film 41 for insulating the second layer and a third layer is provided on an upper layer side of the TFT 30. The interlayer insulating film 41 is formed of for example, a TEOS film with a film thickness of 300 nm. In the interlayer insulating film 41, a contact hole 83 for electrically connecting the pixel electrode side source/drain region 1e and a lower capacitive electrode 71 of the storage capacitor 70 is opened. In addition, a contact hole 81 for electrically connecting the data line side source/drain region 1d and the data line 6a is also opened.

On a third layer of an upper layer side of the interlayer insulating film 41, the storage capacitor 70 having the lower capacitive electrode 71 and an upper capacitive electrode 300 facing the lower capacitive electrode 71 with a dielectric film 75 interposed therebetween is formed.

The upper capacitive electrode is integrally formed with the capacitive line 300. The capacitive line 300 has, for example, a three-layer structure obtained by sandwiching an aluminum (Al) film having a film thickness of 150 nm between titanium nitride (TiN) films respectively with film thicknesses of 50 nm and 100 nm. The detailed configuration of the capacitive line 300 is not shown, but extends from the image display region 10a, in which the pixel electrodes 9a are arranged, in the periphery thereof, is electrically connected to a constant voltage source, and is held at a fixed potential. In FIG. 4, the capacitive line 300 has a portion extending in the Y direction so as to overlap with the data line side LDD region 1b, the pixel electrode side LDD region 1c, and the pixel electrode side source/drain region 1e on the semiconductor film 1a and a portion extending from the above-described portion in the X direction. In the capacitive line 300, the portion that extends in the Y direction and the portion extending in the X direction and overlapping with the lower capacitive electrode 71 function as the upper capacitive electrode. Accordingly, the upper capacitive electrode functions as a fixed potential side capacitive electrode held at a fixed potential.

The lower capacitive electrode 71 is formed of, for example, conductive polysilicon with a film thickness of 100 nm. In FIG. 4, the lower capacitive electrode 71 has portions extending in the Y direction and X direction so as to overlap with the upper capacitive electrode 300. The portion extending in the Y direction overlaps with the pixel electrode side source/drain region 1e and is electrically connected to the pixel electrode side source/drain region through a contact hole 83. The portion extending in the X direction is electrically connected to a relay layer 93 of a fourth layer via a contact hole 84 in an exposed portion avoiding the arrangement of the capacitive line 300. The relay layer 93 is electrically connected to a relay layer 402 of a fifth layer via a contact hole 85. In addition, the relay layer 402 is electrically connected to the pixel electrode 9a through the contact hole 86. Accordingly, the lower capacitive electrode 71 functions as the pixel potential side capacitive electrode held at a pixel potential.

The dielectric film 75 has, for example, a double-layer structure obtained by laminating a HTO film having a film thickness of 4 nm and a silicon nitride (SiN) film with the thickness of 15 nm.

In FIG. 5, an interlayer insulating film 42 for interlayer-insulating between the third layer and the fourth layer is formed of for example, a TEOS film having a film thickness of 400 nm at the upper layer side of the storage capacitor 70. The contact hole 84 is opened so as to penetrate through the interlayer insulating film 42 and to reach the surface of the lower capacitive electrode 71. The contact hole 81 is opened so as to penetrate through the interlayer insulating film 42 and 41 and the gate insulating film 2 and to reach the surface of the semiconductor film 1a.

In FIGS. 4 and 5, on the fourth layer, the data line 6a and the relay layer 93 are provided. In FIG. 5, the data line 6a is electrically connected to the data line side source/drain region 1d of the semiconductor layer 1a through the contact hole 81. In addition, the relay layer 93 is electrically connected to the lower capacitive electrode 71 through the contact hole 84. The data line 6a and the relay layer 93 are formed so as to be separated from each other by, for example, forming a thin film composed of a conductive material such as a metallic film on the interlayer insulating film 42 using a thin film forming method and partially removing, that is, patterning the thin film. Accordingly, since the data line 6a and the relay layer 93 can be formed by the same process, it is possible to simplify the process of manufacturing the device. For example, each of the data line 6a and the relay layer 93 has a four-layer structure obtained by laminating a titanium (Ti) film having a film thickness of 20 nm, a TiN film having a film thickness of 50 nm, an Al film having a film thickness of 350 nm and a TiN film having a film thickness of 150 nm in this order.

In FIG. 5, an interlayer insulating film 43 for interlayer-insulating between the fourth layer and the fifth layer is formed of, for example, a TEOS film having a film thickness of 600 nm at the upper layer side of the data line 6a and the relay layer 93. The contact hole 85 is opened so as to penetrate through the interlayer insulating film 43 and to reach the surface of the relay layer 93. In addition, preferably, a planarization process is performed with respect to the surface of the interlayer insulating film 43 by, for example, a Chemical Mechanical Polishing (CMP) method or the like.

On the fifth layer, a shield layer 400 and the relay layer 402 are provided. In FIG. 4, the shield layer 400 extends in the same direction as the data line 6a, that is, the Y direction. In the semiconductor film 1a, the data line 6a and the shield layer 400 are provided in regions facing the channel region 1a', the data line side LDD region 1b and the pixel electrode side LDD region 1c, and the data line side source/drain region 1d and the pixel electrode side source/drain region 1e. Accordingly, light traveling from the upper layer side to these regions in the semiconductor film 1a can be shielded by the data line 6a and the shield layer 400.

In FIG. 5, the relay layer 402 is preferably formed of the same film as the shield layer 400. As described above, the relay layer 402 is electrically connected to the pixel electrode 9a so as to replay the electrical connection between the pixel electrode 9a and the relay layer 93. In addition, each of the shield layer 400 and the relay layer 402 has, for example, a double-layer structure obtained by laminating an Al film with the thickness of 350 nm and a TiN film with the thickness of 150 nm.

In FIG. 5, an interlayer insulating film 44 for interlayer-insulating the fifth layer and a sixth layer is at the upper layer side of the shield layer 400 and the relay layer 402 formed by, for example, a double-layer structure composed of a TEOS film having a film thickness of 600 nm and a boron silicate glass (BSG) film having a film thickness of 75 nm. The contact hole 86 is opened so as to penetrate through the interlayer insulating film 44 and to reach the surface of the relay layer 402. In addition, a planarization process is performed with respect to the surface of the interlayer insulating film 44.

In FIGS. 4 and 5, the pixel electrode 9a is formed on the sixth layer. As shown in FIG. 5, the pixel electrode 9a is electrically connected to the pixel electrode side source/drain region 1e of the semiconductor film 1a while performing relaying by the relay layers 402 and 93 and the lower capacitive electrodes 71 through the contact holes 86, 85, 84 and 83. As described above with reference to FIG. 2, the alignment film which is subjected to the predetermined alignment processes such as the rubbing process is provided on the upper side surface of the pixel electrode 9a.

The above-described configuration of the pixel portion is common in the pixel portions, as shown in FIG. 4. The pixel portions are periodically formed in the image display region 10a (see FIG. 1).

Next, the configuration of the TFT 30 which is the feature of the present embodiment will be described in more detail with reference to FIG. 6.

Figure 6:
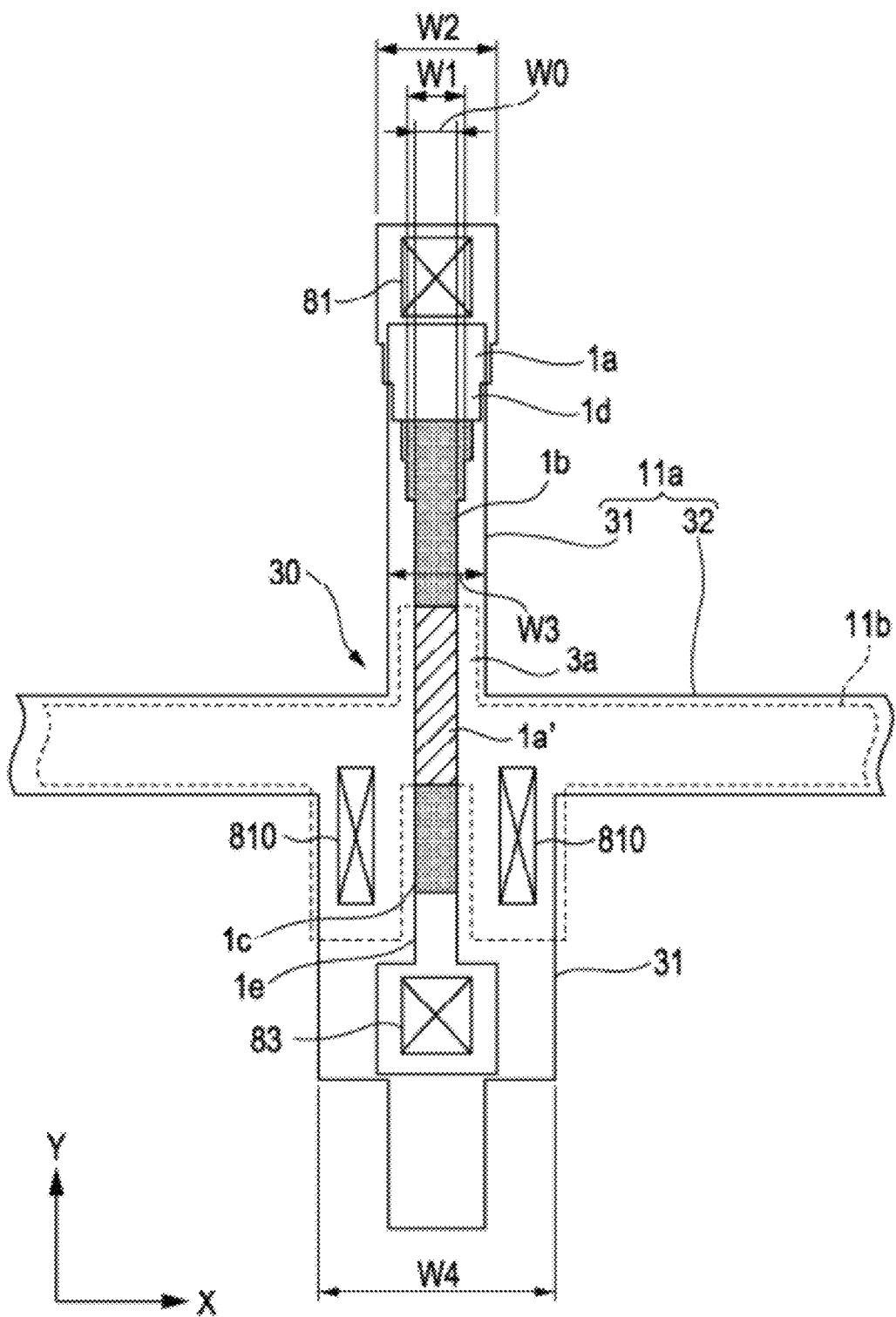
FIG. 6 is a plan view showing the main configuration associated with an arrangement relationship between first and second scan lines and a TFT, in each of a first layer and a second layer.

FIG. 6 is a plan view showing the main configuration associated with an arrangement relationship between the first and second scan lines and the TFT, in each of the first layer and the second layer.

As described above, the TFT 30 has the LDD structure, the data line side LDD region 1b and the pixel electrode side LDD region 1c are formed as low-concentration impurity regions in the semiconductor film 1a, and the data line side source/drain region 1d and the pixel electrode side source/drain region 1e are formed as high-concentration impurity regions. In the present embodiment, at least one of the data line side LDD region 1b and the pixel electrode side LDD region 1c is formed such that the width thereof is adjusted as follows according to a change in impurity concentration of at least one of the data line side source/drain region 1d and the pixel electrode side source/drain region 1e corresponding thereto.

As described with reference to FIGS. 4 and 5, the first scan line 11a is formed on the first layer of the lower layer side of the TFT 30 so as to function as the lower light-shielding film. This lower light-shielding film 11a has an extension portion 31 extending in the extending direction (Y direction) of the semiconductor film 1a and at least partially overlapping with the semiconductor film 1a, and a main body portion 32 extending in a direction (X direction) intersecting the extending direction of the extension portion 31. The main body portion 32 is doubly provided in the X direction together with the second scan line 11b and configures a portion of the scan line 11.

As described above, the extension portion 31 at least partially overlaps with the data line side LDD region 1b and the pixel electrode side LDD region 1c of the semiconductor film 1a, and the data line side source/drain region 1d and the pixel electrode side source/drain region 1e, and at least partially shields these regions from return light or the like traveling from the TFT array substrate 10 side. The channel region 1a' of the semiconductor film 1a is disposed so as to overlap with an intersecting portion of the extension portion 31 and the main body portion 32. Accordingly, the light having a travel direction, which can be shielded by the extension portion 31 and the main body portion 32, can be shielded by the intersecting portion of the extension portion 31 and the main body portion 32. Accordingly, the light traveling to the channel region 1a' can be shielded with more certainty, and thus light leak current can be suppressed.

In FIG. 6, the extension portion 31 is formed such that the width W4 of at least the portion overlapping with the pixel electrode side LDD region 1c is wider than the width W3 of the portion overlapping with the data line side LDD region 1b. Accordingly, the pixel electrode side LDD region 1c can be shielded by the extension portion 31 in the region wider than the data line side LDD region 1b on the TFT array substrate 10. Light leak current may be relatively more easily generated in the pixel electrode side LDD region 1c compared with in the data line side LDD region 1b. Accordingly, the light-shielding property to the pixel electrode side LDD region 1c can be further improved by the extension portion 31, and thus light leak current can be reduced with more certainty.

Now, a comparative example of the present embodiment will be described with reference to FIG. 7, concentrating on only the configuration of different from the present embodiment.

Figure 7:
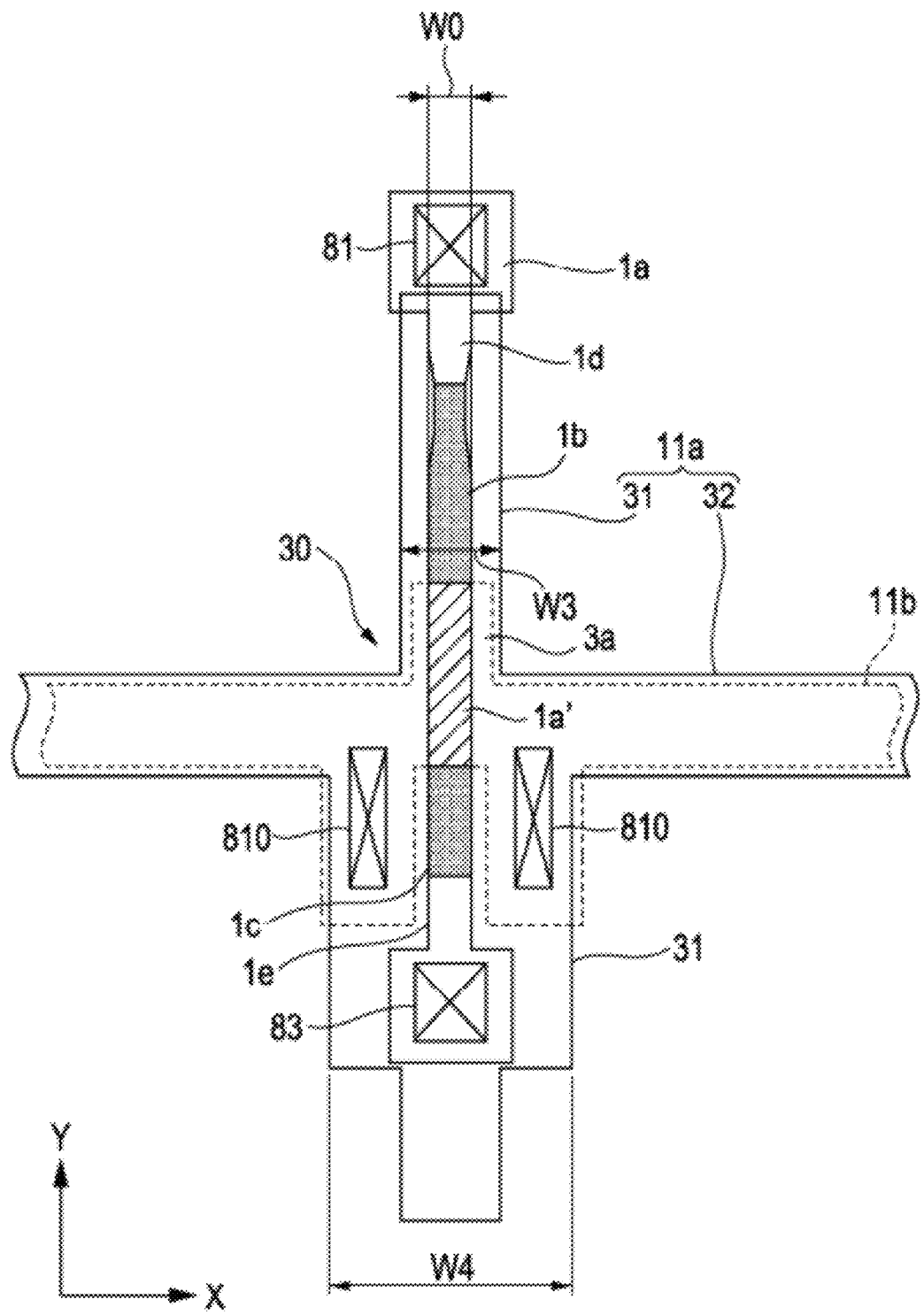
FIG. 7 is a plan view showing the main configuration associated with an arrangement relationship between various types of components corresponding to FIG. 6, in a comparative example.

FIG. 7 is a plan view showing the main configuration associated with an arrangement relationship between various types of components corresponding to FIG. 6, in the comparative example.

In FIG. 7, the comparative example is different from the present embodiment in that, in view of the design, the first junction region 1b has a width W0 which is equal to that of the channel region 1a'. In the extension portion 31, with respect to the portion overlapping with the data line side LDD region 1b which is formed such that the width thereof is smaller than that of the portion overlapping with the pixel electrode side LDD region 1c (W3<W4), a step difference shape due to the film thickness of the extension portion 31 is generated in the direction intersecting the extending direction (Y direction) of the extension portion 31, and, due to the this step difference shape, a step difference is generated in the surface of the underlying insulating film 12 located under the semiconductor film 1a shown in FIG. 5. Based on the step difference shape of the surface of the underlying insulating film 12, the width of the boundary to the data line side source/drain region 1d of the data line side LDD region 1b is locally smaller than the design width W0 which is equal to the channel region 1a', and thus a constricted shape may be generated.

As described with reference to FIG. 6, the light-shielding property of the return light may deteriorate in the portion of the extension portion 31 overlapping with the data line side LDD region 1b having the small width. In addition, since the constricted shape shown in FIG. 7 occurs in the semiconductor film 1a, electrolysis mitigation effect based on a concentration gradient between the regions in the boundary to the data line side source/drain region 1d of the data line side LDD region 1b is disturbed and thus leak current may be apt to be generated. Accordingly, as a result, light leak current may be increased.

Figure 8:
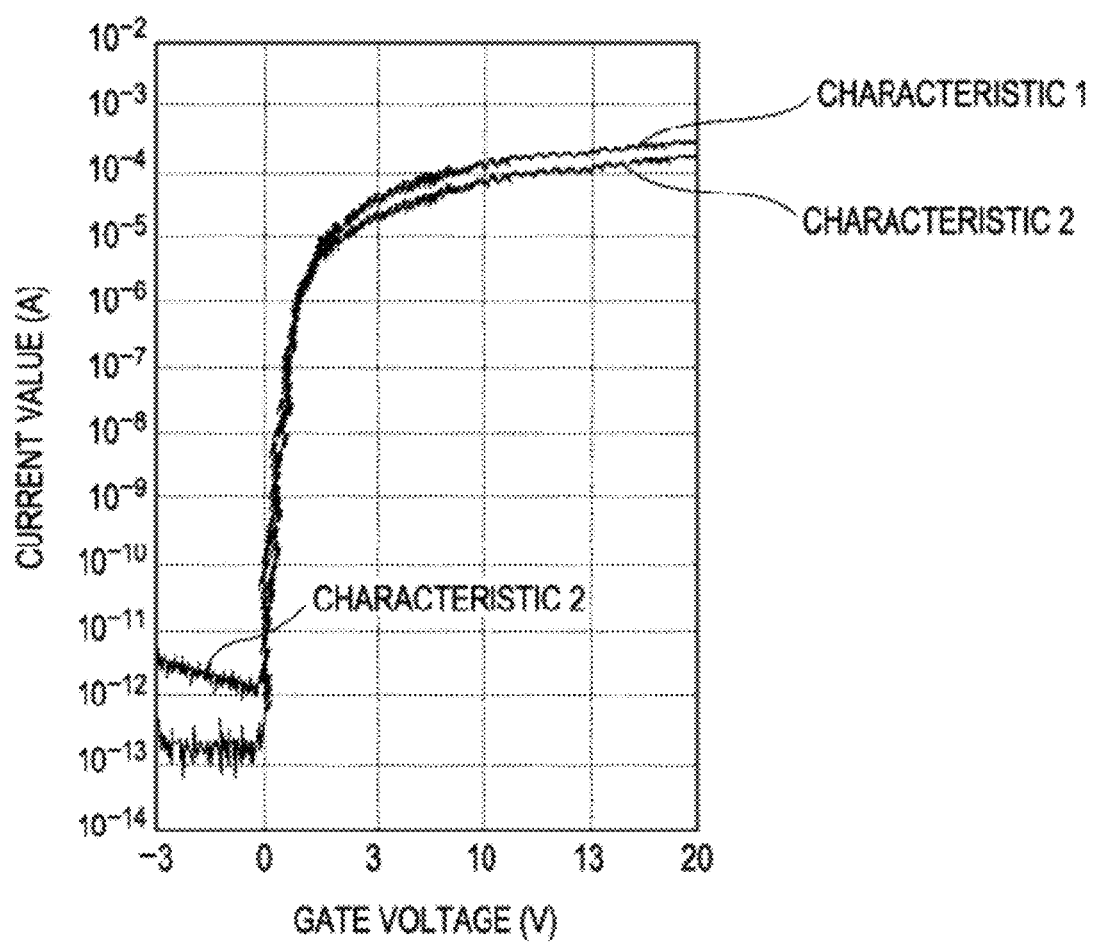
FIG. 8 is a view showing electrical characteristics of the TFT in the comparative example shown in FIG. 7.

FIG. 8 is a view showing electrical characteristics of the TFT in the comparative example shown in FIG. 7. In FIG. 8, the horizontal axis denotes a gate voltage (V), the vertical axis denotes a current value (A), and characteristic 1 and characteristic 2 are shown. The characteristic 1 shows good electrical characteristic of the TFT 30 and the characteristic 2 shows electrical characteristic of the TFT 30 of the comparative example shown in FIG. 7. In FIG. 8, in a threshold value or less in the vicinity of 0 V of the gate voltage of the TFT 30, the off current is not mostly or ideally generated according to the characteristic 1, but the value of the off current, that is, the leak current is increased according to the characteristic 2.

In FIG. 6, in the present embodiment, in particular, at least one of the data line side LDD region 1b and the pixel electrode side LDD region 1c of the semiconductor film 1a of the TFT 30 is formed with a width at least partially larger than that of the channel region 1a' (that is, is formed such that the width thereof is at least partially larger than that of the channel region 1a'). In more detail, preferably, in the semiconductor film 1a, the data line side LDD region 1b is formed with a width larger than the width W0 of the channel region 1a' according to the change in impurity concentration to the data line side source/drain region 1d. In the boundary to the data line side source/drain region 1d of the data line side LDD region 1b, the impurity concentration is changed from a low value to a high value. According to such a change in impurity concentration, the data line side LDD region 1b is formed with a width at least partially larger than the width W0 of the channel region 1a'. That is, in order to maintain the change in impurity concentration, in the data line side LDD region 1b, the boundary to the data line side source/drain region 1d is formed with a width W1 larger than that of the channel region 1a', and is formed such that the width thereof is not decreased against the change of the impurity concentration (change from the low or small value to the high or large value). Accordingly, with respect to the data line side LDD region 1b, the concentration gradient based on the change in impurity concentration in the boundary to the data line side source/drain region 1d can be supplementarily maintained by the wide shape. Thus, the electrolysis mitigation effect based on the concentration gradient between the data line side LDD region 1b and the data line side source/drain region 1d can be properly maintained and thus leak current can be reduced. Upon the design, as described above, if at least the width of the data line side LDD region 1b is adjusted, it is possible to easily manufacture the TFT 30 without performing a new process in the manufacturing process, compared with JP-A-5-3209.

Preferably, the data line side source/drain region 1d is formed with a width at least partially larger than that of the data line side LDD region 1b (that is, the width of the data line side source/drain region 1d is at least larger than that of the data line side LDD region 1b). Accordingly, the width of the semiconductor film 1a is changed to be increased from the data line side LDD region 1b to the data line side source/drain region 1d with the boundary thereof interposed therebetween. Therefore, the data line side LDD region 1b can be formed in the boundary to the data line side source/drain region 1d such that the width thereof is not decreased with more certainty. In this case, as shown in FIG. 6, in the semiconductor film 1a, from the data line side LDD region 1b to the data line side source/drain region 1d, the width is consecutively changed by two steps or more such that the width W0 is finally changed to the width W2. Accordingly, the dimension change in the width is slow, that is, the dimension gradient based on the dimension change in width can be decreased. Therefore, influence on current density based on the concentration gradient of the impurities from the data line side LDD region 1b to the data line side source/drain region 1d is decreased and thus electrolysis mitigation effect can be further improved.

Accordingly, since the width of the data line side LDD region 1b is not decreased in the boundary to the data line side source/drain 1*d*, it is possible to prevent the constricted shape from being generated in the semiconductor film 1*a*. In addition, even when the light-shielding property of the data line side LDD region 1*b* further deteriorates than the pixel electrode side LDD region 1*c* by light shielding by the portion having the width smaller than that of the extension portion 31, in the data line side LDD region 1*b* described above, the electrolysis mitigation effect based on the concentration gradient of the impurities in the boundary to the data line side source/drain region 1*d* can be properly maintained, and thus the generation of light leak current can be suppressed.

Figure 9:
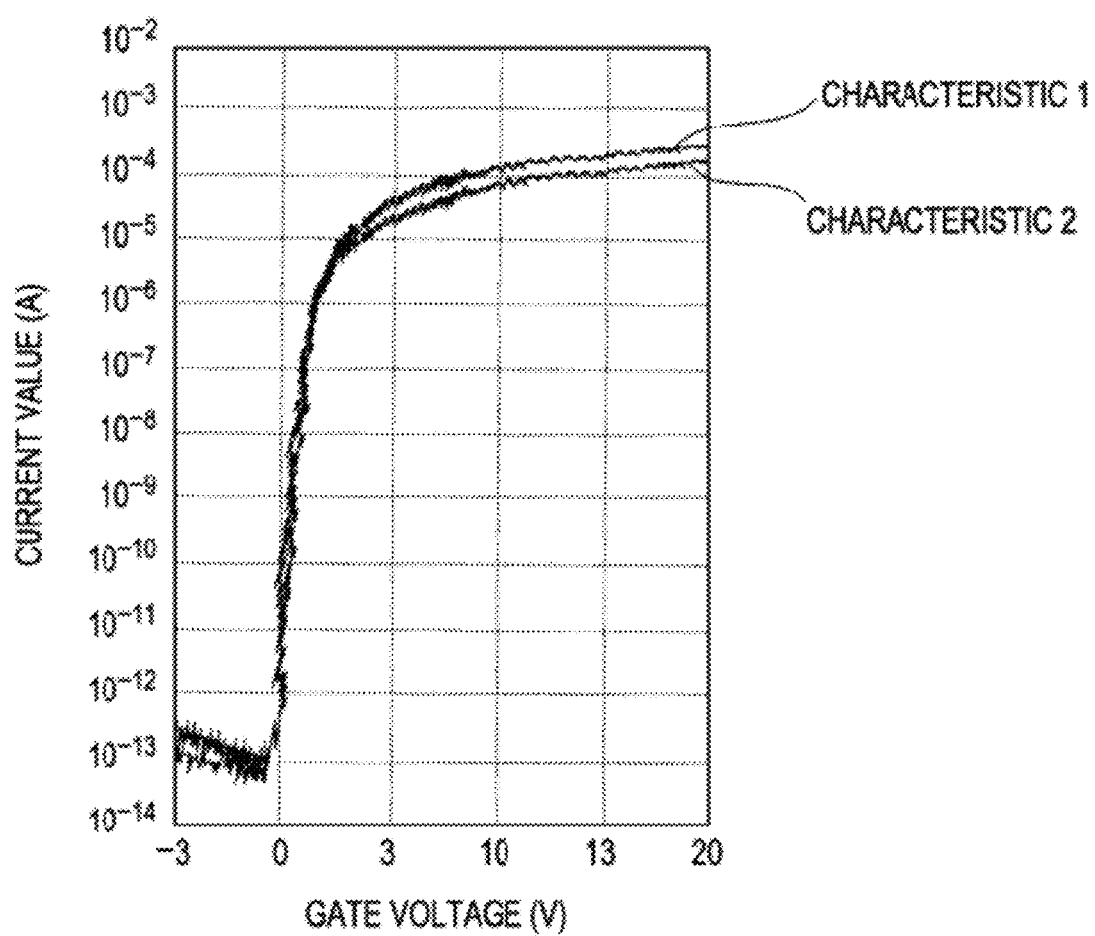
FIG. 9 is a view showing electrical characteristics of the TFT according to the present embodiment.

FIG. 9 is a view showing electrical the characteristics of the TFT according to the present embodiment. In FIG. 9, similar to FIG. 8, the horizontal axis denotes a gate voltage (V), the vertical axis denotes a current value (A), and characteristic 1 and characteristic 2 are shown. The characteristic 1 shows good electrical characteristic of the TFT 30 and the characteristic 2 shows electrical characteristic of the TFT 30 of the present embodiment. In FIG. 9, compared with the electrical characteristics of the comparative example shown in FIG. 8, in a threshold value or less in the vicinity of 0 V of the gate voltage of the TFT 30, in the characteristic 2, leak current can be decreased to the same degree as the characteristic 1 by two digits than the characteristic 2 of the comparative example.

The configurations of the data line side LDD region 1*b* and the data line side source/drain region 1*d* described above may be similarly applied to the pixel electrode side LDD region 1*c* and the pixel electrode side source/drain region 1*e* of the semiconductor film 1*a*, in addition to or instead of these regions.

Accordingly, in the present embodiment described above, it is possible to suppress leak current of the TFT 30 in each of the pixel portions so as to improve display quality and to manufacture the device by a simpler manufacturing process.

Next, the application of the liquid crystal device, which is the electro-optical device, to various types of electronic apparatus will be described.

Figure 10:
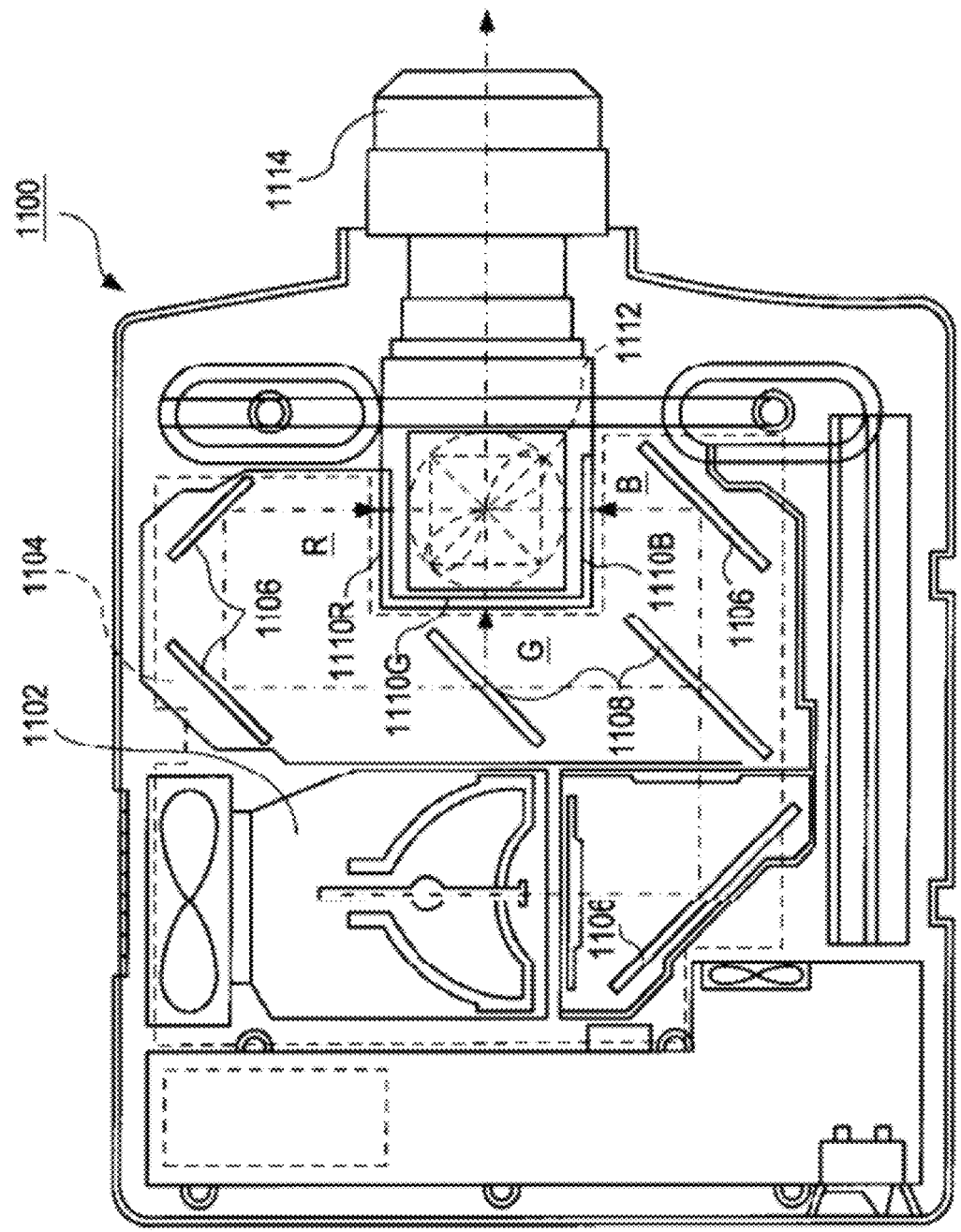
FIG. 10 is a plan view showing the configuration of a projector which is an example of an electronic apparatus including the liquid crystal device.

FIG. 10 is a plan view showing the configuration of a projector. Hereinafter, the projector using this liquid crystal device as a light valve will be described.

As shown in FIG. 10, a lamp unit 1102 composed of a white light source such as a halogen lamp is provided inside the projector 1100. An incident light emitted from the lamp unit 1102 is separated into three primary colors of RGB by four mirrors 1106 and two dichroic mirrors 1108 disposed inside a light guide 1104 and the three primary colors are incident to light valves 1110R, 1110G, and 1110B as the light valves corresponding to the primary colors.

The configurations of the liquid crystal panels 1110R, 1110G, and 1110B are equal to the above-described liquid crystal device and the liquid crystal panels are driven by primary color signals of R, G, and B supplied from the image signal processing circuit. The light modulated by such liquid panels is incident into a dichroic prism 1112 from three directions. In the dichroic prism 1112, the light of R and B is refracted at an angle of 90 degrees and the light of G goes straight. Therefore, the images of the colors are synthesized, whereby a color image is projected onto a screen or the like through a projector lens 1114.

In addition to the electronic apparatus described in FIG. 10, there are a mobile type personal computer, a mobile telephone, a liquid crystal TV set, a viewfinder-type or direct-view monitor type video tape recorder, a car navigation system, a pager, an electronic organizer, an electronic calculator, a word processor, a workstation, a videophone, a POS terminal, a touch-panel-equipped device, and the like. The invention is applicable to various types of electronic apparatuses.

The invention is applicable to a reflective type liquid crystal device (LCOS) in addition to the liquid crystal devices described in the above-described embodiments.

The invention is not limited to the above-described embodiments and modification may be properly made without departing from the spirit of the invention as defined by the appended claims and the specification. An electro-optical device including such modifications, an electronic apparatus including the electro-optical device and a transistor are included in the technical range of the invention.

What is claimed is:

1. An electro-optical device comprising:
   a substrate; and
   a transistor that includes:
      a gate electrode;
      a semiconductor film that includes a first source and a first drain; and
      a channel region that is formed between the first source and the first drain, at least a part of a light-shielding film overlapping with the semiconductor film, the light-shielding film having:
      a first portion that extends along a first direction;
      a second portion that protrudes from the first potion along a second direction intersecting the first direction; and
      a third portion that protrudes from the first portion along a third direction intersecting the first direction,
   the first portion having a first width along the second direction,
   the second portion having a second width along the first direction,
   the third portion having a third width along the first direction,
   the second portion and the third portion being formed such that the second width is smaller than the third width, and
   the semiconductor film having a first part,
   at least a part of the second portion overlapping with the first part,
   the first part having a fourth width along the first direction,
   the channel region having a fifth width along the first direction, and
   the fourth width being greater than the fifth width.

2. The electro-optical device according to claim 1, the third direction being opposite to the second direction.

3. The electro-optical device according to claim 1, further comprising a scan line that extends along the first direction.

4. The electro-optical device according to claim 1, the light-shielding film being formed between the substrate and the semiconductor film.

5. The electro-optical device according to claim 1, further comprising:
   a data line that extends along the second direction; and
   a scan line that extends along the first direction,
   the channel region overlapping with an intersection portion at which the data line intersects the scan line.

6. The electro-optical device according to claim 1, further comprising:
   a data line that is electrically connected to the first source, and
   a pixel electrode that is electrically connected to the first drain.

7. The electro-optical device according to claim 1, further comprising a scan line that extends along the first direction, the channel region overlapping with the scan line and the light-shielding film.

8. The electro-optical device according to claim 1, further comprising a scan line that extends along the first direction, the scan line overlapping with the light-shielding film.

9. The electro-optical device according to claim 1, further comprising a scan line that extends along the first direction, the scan line overlapping with the first portion of the light-shielding film.

\* \* \* \* \*